United States Patent [19]
Jentz et al.

[11] Patent Number: 4,985,684
[45] Date of Patent: Jan. 15, 1991

[54] FULLY INTEGRATED DIGITAL FM DISCRIMINATOR

[75] Inventors: Bradley F. Jentz, Barrington; Francis R. Yester, Arlington Heights, both of Ill.

[73] Assignee: Motorola, Inc., Schaumburg, Ill.

[21] Appl. No.: 402,118

[22] Filed: Aug. 31, 1989

[51] Int. Cl.$^5$ ............................................. H03D 1/00
[52] U.S. Cl. .................................. 329/327; 329/336; 329/341
[58] Field of Search ...................... 329/327, 336, 341; 375/80

[56] References Cited

U.S. PATENT DOCUMENTS 4,675,882 6/1987 Lillie et al. ...................... 329/327 X Primary Examiner—Robert J. Pascal
Attorney, Agent, or Firm—Darleen J. Stockley

[57] ABSTRACT

A single substantially non-programmable fully integrated circuit for a digital frequency modulated discriminator is provided whereby frequency variations of a digitized frequency modulated information signal are linearly converted to amplitude variations. Matched pairs of data words from the digitized information signal are used to obtain a phase octant, one of eight equal sectors of the 360 degree spectrum. Further manipulations of the pairs of data words provide a coarse phase measurement, being some integral multiple of $\pi/2$, and a fine phase correction factor less than or equal to $\pi/4$ radians. The coarse phase measurement is combined with the fine phase correction factor. The sum is differentiated and demodulated, yielding the original information signal.

10 Claims, 3 Drawing Sheets

FULLY INTEGRATED DIGITAL FM DISCRIMINATOR

BACKGROUND OF THE INVENTION

This invention relates generally to radio frequency data communication signal receivers, and more particularly to radio frequency processing and discrimination principles.

Analog implementations of signal processing have long been used in radio receivers. Although analog integrated circuits are often referred to as linear, such circuits are completely dependent on a variety of manufacturing technologies which generate a product, often producing outputs which are only analogous or similar to the input signals.

Digital signal processors (DSPs) began to impact the industrial and communication areas in the 1970's and 1980's due to their improved sensitivity and the characteristic of generally widespread compatibility of digital devices. DSPs are noted for their linearity in conversion of information signals, general imperviousness to age and temperature, and relative independence of sampling rates with concomitant reduction of chip area requirements and associated time demands pursuant thereto. DSPs, however, often contain sophisticated programmable circuitry that necessitates significant microprocessor or microcomputer memory; this aspect often is costly. In addition, the programmable aspect of DSPs is very power-consuming.

Although digital signal processing technology has been combined with analog implementation to achieve a result for discriminators which far improves the analog system alone, it is desirable to have the advantages of digital discrimination without the associated present costs.

SUMMARY OF THE INVENTION

The need for significant performance improvement is substantially met by the device and method of the present invention. Pursuant to this invention, an FM discriminator is provided as a single integrated circuit. Unlike DSP-based discriminator embodiments, the integrated circuit of the invention is substantially non-programmable.

This invention takes advantage of the fact that total integration of a digital frequency discriminator provides numerous desirable performance characteristics, including lower current drain, substantially perfect linearity, and little age or temperature-induced drift. By careful selection of the number of bits and devices necessary for each signal processing step, chip area and current drain can be limited. At the same time, full integration of the elements of the discriminator allows implementation of a system with low power requirements, and because this fully integrated discriminator's use does not depend on the sampling rate of the information signals, it facilitates a highly flexible demodulation system.

BEST MODE FOR CARRYING OUT THE INVENTION

Figure 1:
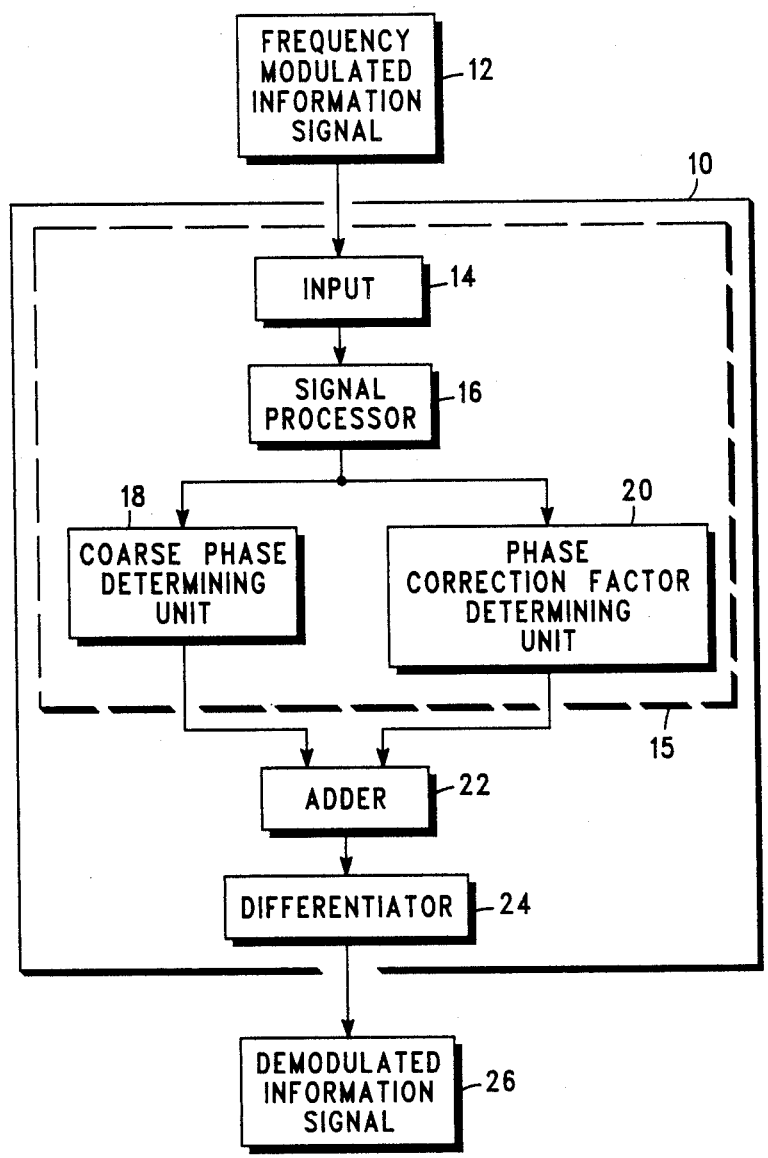
FIG. 1 is a block diagram of a digital FM discriminator according to the invention.

FIG. 1 generally depicts a digital FM discriminator (10). A frequency modulated information signal (12) is transmitted to an input (14) that digitizes the signal, yielding an in-phase (I) amplitude data signal and a quadrature (Q) amplitude data signal. The input (14) is connected to a phase determining unit (15), which consists of a signal processor (16), a coarse phase determining unit (18), and a phase correction factor determining unit (20), all of which utilize I and Q. The signal processor (16) compares unsigned values of I and Q to obtain an equivalent phase position. The coarse phase determining unit (18) determines a unit multiple of $\pi/2$ for the equivalent phase position obtained. The phase correction factor determining unit (20) provides division information as to I and Q, which is converted to a fine phase correction factor less than or equal to $\pi/4$ radians. The output of the phase determining unit (15) connects to an adder (22), which substantially reproduces the actual phase of the received frequency modulated information signal. The adder (22) is connected to a differentiator circuit (24) which converts the phase information to a demodulated information signal (26).

Figure 2:
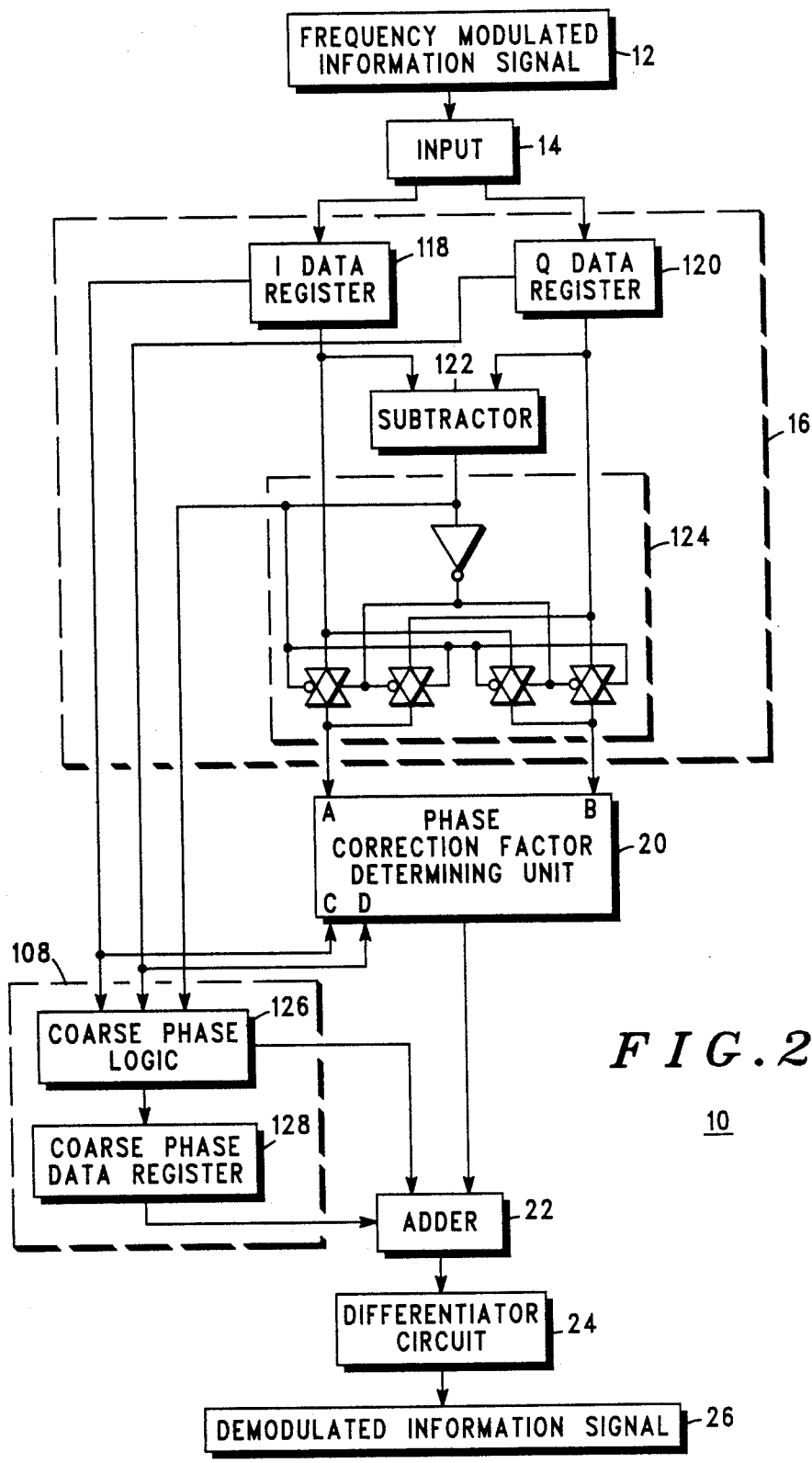
FIG. 2 is a more detailed block diagram of the discriminator depicted in FIG. 1.

FIG. 2 depicts the over-all discriminator circuit (10) in greater detail. The frequency modulated information signal (12) is transmitted to the input (14) which digitizes the information signal, producing at least one matched pair (I,Q) of data words. The matched pairs (I,Q) of data words are stored in data registers (118, 120). The data registers (118, 120) are connected to a subtractor (122), a set of gates (124), a coarse phase determining unit (108); and a phase correction factor determining unit (20). The matched pairs (I,Q) of data words are compared in the subtractor (122) to obtain an equivalent phase position. The coarse phase determining unit (108) is connected to an adder (22) and utilizes a coarse phase logic unit (126) to compare the matched pairs (I,Q) of data words with the equivalent phase position determined by the subtractor (122), obtaining a coarse phase for each matched pair, and ultimately storing this coarse phase in the coarse phase data register (128) (a register of relatively small size, one workable size being 2 bits). A set of gates (124) is connected to the phase correction factor determining unit (20). This set of gates (124) selects a division operation as between each matched set of I and Q. The phase correction factor determining unit (20) is connected to the adder (22), and obtains the division information selected, causing the division information to be converted to a fine phase correction factor, which is stored in a suitably sized fine phase ROM register (212) (one workable size being 5 bits). The adder (22) combines the coarse phase and the fine phase correction factor expeditiously due to the small field sizes. The limited field sizes also produce significantly smaller current drains and chip sizes than current DSP units. The adder (22) is connected to a differentiator circuit (24). The differentiator circuit (24) is connected to an output (26), and provides a demodulated information signal output.

Figure 3:
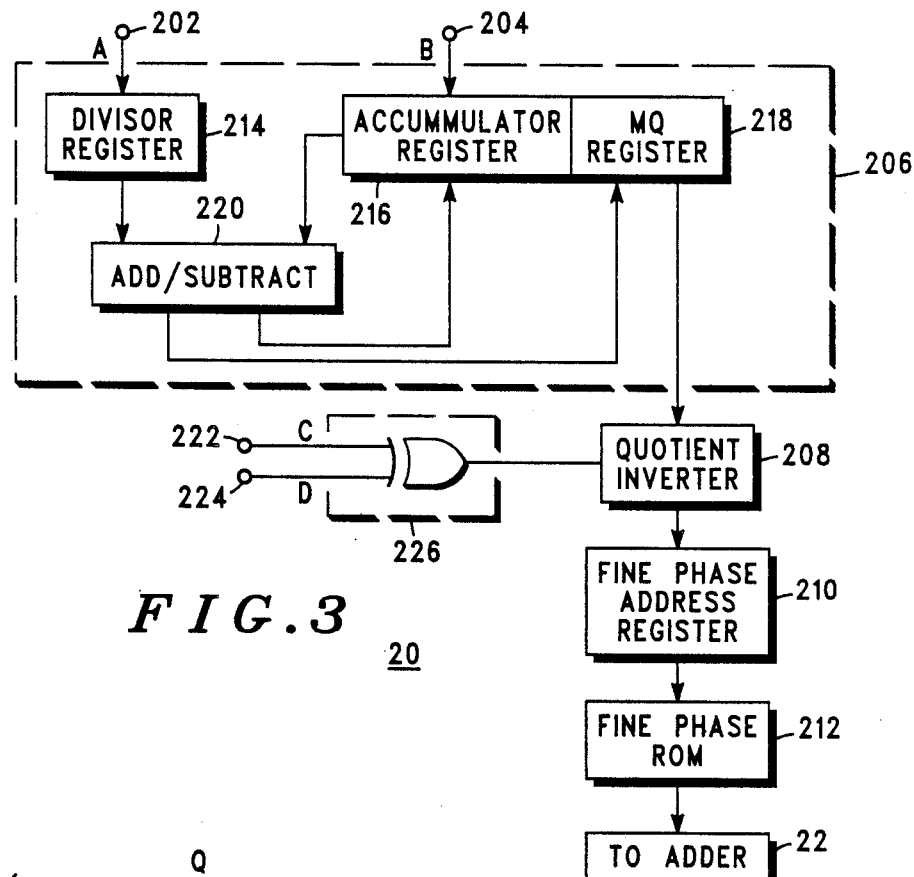
FIG. 3 is a block diagram of the phase correction factor determining unit.

FIG. 3 shows the phase correction factor determining unit (20) in greater detail. Gated outputs A (202) and B (204) from the signal processor (16) are inputs to a divider circuit (206). Gated input A (202) connects to a divisor register (214) and gated input B (204) connects to an accummulator register (216). Both the divisor register (214) and the accummulator-MQ register (216, 218) are limited in size to reduce current drain (16 bits being one of the workable bit sizes for the registers). The divisor register (214) and accummulator register (216) connect to an add/subtract unit (220) that circulates its data computation result back to the accummulator register (216) and also to the MQ register (218). The MQ register (218) stores an accummulated quotient value for each data pair calculation. Data signals C (222) and D (224) represent the matched pairs of I and Q, respectively, which are transmitted to an exclusive-or unit (226). The MQ register (218) output, together with an invert control signal computed by the exclusive-or unit (226), feed into the quotient inverter (208) which inverts the quotient according to certain predetermined characteristics set forth in Table II of FIG. 4. The quotient inverter (208) is connected to a fine phase data address register (210) which is connected to a suitably sized fine phase ROM (212) (a 32×5 fine phase ROM being one of the workable sizes). The fine phase ROM (212) generates the fine phase value in radians and connects to the adder (22).

Figure 4:
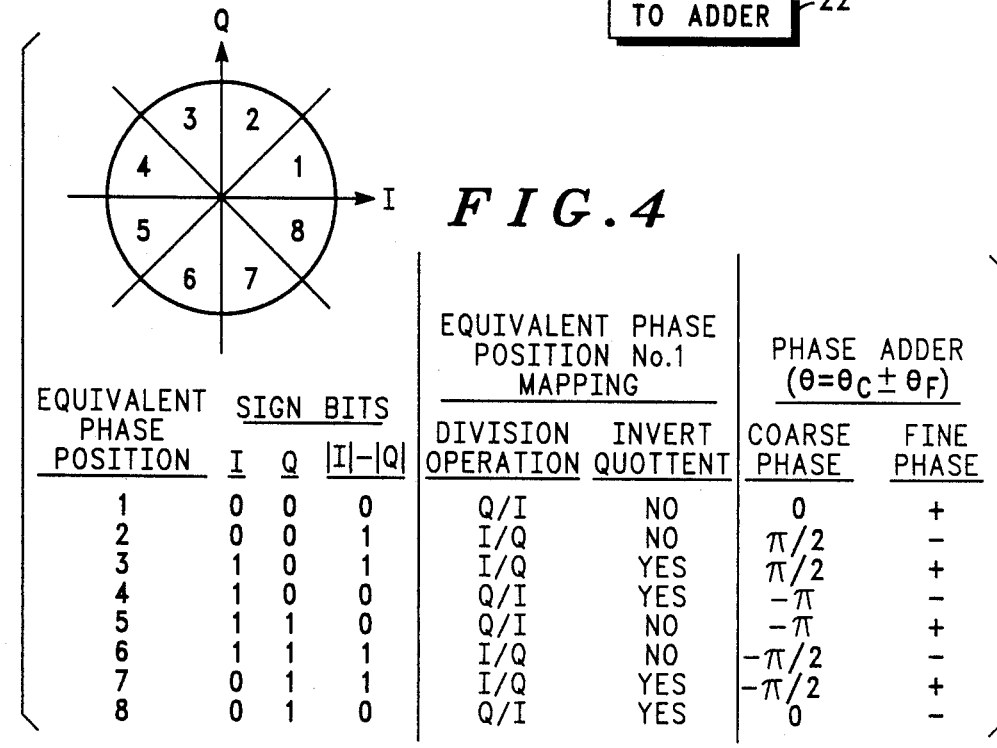
FIG. 4 is a set of three tables.

FIG. 4 is a set of three tables setting forth phase computation information with respect to the equivalent phase position, including: Table I listing available sign bits of the in-phase amplitude data signal (I), the quadrature amplitude data signal (Q), and the absolute value of the difference between the two data signals pursuant to the equivalent phase position; Table II listing the division operation and quotient inversion characteristics of each equivalent phase position; and Table III listing a coarse phase value and a sign for a fine phase correction factor for each equivalent phase position.

Accordingly what is claimed is:

1. A digital FM discriminator comprising:
   (A) a first means for receiving and processing a non-quantized signal that includes a frequency modulated information signal having a phase with an equivalent phase position to determine a coarse phase value and a fine phase value; and
   (B) a second means responsive to the first means for outputting a demodulated information signal; and
   wherein the first means and second means are formed integrally in a common substantially non-programmable integrated circuit.

2. A digital FM discriminator comprising:
   (A) input means for receiving a frequency modulated information signal sample having a phase;
   (B) signal processing means for processing the frequency modulated information signal sample from the input to obtain an equivalent phase position determination;
   (C) coarse phase determining means operably coupled to the signal processing means, for providing a coarse phase component from the equivalent phase position for the sample;
   (D) fine phase determining means operably coupled to the signal processing means, for providing a fine phase correction factor from the equivalent phase position for the sample;
   (E) phase recovery means that receives the coarse phase component and the fine phase correction factor for providing a recovered phase value for the sample; and
   (F) computation means for converting the recovered phase value to a demodulated information signal sample;
   wherein the input means, signal processing means, coarse phase determining means, fine phase determining means, phase recovery means and computation means are all formed integrally in a common substantially non-programmable integrated circuit.

3. A digital FM discriminator as described in claim 2 wherein the input means comprises:
   sampling means for transforming the frequency modulated information signal sample to at least one set of (I,Q) data word pairs;
   wherein the input means, sampling means, signal processing means, coarse phase determining means, fine phase determining means, and phase recovery means are all formed integrally in a common substantially non-programmable integrated circuit.

4. A digital FM discriminator as described in claim 3 wherein the signal processing means comprises:
   (A) storage means for tabulating at least some of the set of (I,Q) data word pairs;
   (B) computation means for obtaining difference information as between the data word pairs, absent their respective sign bits; and
   (C) gating means for selecting from division operations Q/I and I/Q.

5. A digital FM discriminator as described in claim 3 wherein the coarse phase determining means comprises:
   (A) phase magnitude determining means for selecting a unit multiple of $\pi/2$ radians; and
   (B) storage means for tabulating said unit multiple of $\pi/2$ radians.

6. A digital FM discriminator as described in claim 3 wherein the fine phase determining means comprises:
   (A) first storage means for storing a value;
   (B) second storage means for storing a second value, including subsequent changes due to an aggregation of values determined by subsequent computations of at least one sum/difference information;
   (C) computation means for obtaining at least one sum/difference information as between the first storage means and the second storage means;
   (D) third storage means for storing a final aggregation of values determined by computations of sum/difference information;
   (E) selection means for determining necessity of inversion of the final aggregation of values;
   (F) manipulation means for inverting the final aggregation of values to obtain an intermediate value; and
   (G) conversion means for changing the intermediate value to radians.

7. A method for discriminating a digital frequency modulated signal, wherein a substantially non-programmable circuit is essentially integrated, comprising the steps of:
   (A) receiving a signal for processing that includes a frequency modulated information signal having a phase with an equivalent phase position to determine a coarse phase value and a fine phase value; and
   (B) utilizing a quotient of the coarse phase value and the fine phase value to output a demodulated information signal.

8. A method for discriminating a digital frequency modulated signal, wherein a substantially non-programmable circuit is essentially integrated, comprising the steps of:
   (A) receiving a signal that includes a frequency modulated information signal;
   (B) determining an equivalent phase position for the frequency modulated information signal;

(C) determining a coarse phase component from the equivalent phase position;
(D) determining a fine phase correction factor from the equivalent phase position;
(E) providing a recovered phase value from combining the coarse phase component and the fine phase correction factor; and
(F) converting the recovered phase value to a demodulated information signal sample.

9. A digital FM discriminator comprising:
(A) a first means for receiving and processing a non-scaled signal that includes a frequency modulated information signal having a phase with an equivalent phase position to determine a coarse phase value and a fine phase value; and
(B) a second means responsive to the first means for outputting a demodulated information signal; and
wherein the first means and second means are formed integrally in a common substantially non-programmable integrated circuit.

10. A digital FM discriminator as described in claim 9 wherein the non-scaled signal in (A) is also non-quantized.

* * * * *